(12) United States Patent
Hwang

(10) Patent No.: US 7,136,434 B2
(45) Date of Patent: Nov. 14, 2006

(54) APPARATUS AND METHOD FOR DETECTING ENERGY OF TONE SIGNAL

(75) Inventor: Sung-hyun Hwang, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 722 days.

(21) Appl. No.: 10/287,770

(22) Filed: Nov. 5, 2002

(65) Prior Publication Data
US 2003/0093447 A1 May 15, 2003

(30) Foreign Application Priority Data
Nov. 9, 2001 (KR) ................ 2001-69657

(51) Int. Cl.
*H03D 1/00* (2006.01)
(52) U.S. Cl. .............. 375/340; 324/76.57; 370/526; 708/312; 84/616
(58) Field of Classification Search .............. 375/340; 367/46; 712/225; 704/233; 708/420
See application file for complete search history.

(56) References Cited

U.S. PATENT DOCUMENTS

| | | | |
|---|---|---|---|
| 4,713,748 A * | 12/1987 | Magar et al. ........... | 712/225 |
| 4,974,187 A * | 11/1990 | Lawton ............... | 708/420 |
| 5,764,858 A * | 6/1998 | Sheu et al. ........... | 706/26 |

FOREIGN PATENT DOCUMENTS

| JP | 3-52423 A | 3/1991 |
|---|---|---|
| JP | 5-336102 A | 12/1993 |
| JP | 9-27802 A | 1/1997 |
| JP | 9-139733 A | 5/1997 |
| JP | 10-163949 A | 6/1998 |
| JP | 11-177544 A | 7/1999 |

OTHER PUBLICATIONS

Kaiser, J.F.; On a simple algorithm to calculate the energy of a signal, Apr. 3-6, 1990, International Conference on Acoustics, Speech, and Signal Processing, pp. 381-384.*
Higher order differential energy operators; Maragos, P.; Potamianos, A.; Higher Order Differential Energy Operators, Aug. 1995, IEEE Signal Processing Letters, vol. 2, Issue 8, pp. 152-154.*

* cited by examiner

*Primary Examiner*—Mohammed Ghayour
*Assistant Examiner*—Adolf DSouza
(74) *Attorney, Agent, or Firm*—Sughrue Mion, PLLC

(57) ABSTRACT

An apparatus and a method for detecting the energy of a tone signal. A pre-process unit takes absolute values of transmitted samples and outputs the values to a delay unit for delaying the transmitted samples according to a predetermined delay interval. An operation unit subtracts the value calculated by multiplying the magnitudes of the samples transmitted before and after the burst detection from the square value of the magnitude of the sample at the time of burst detection among the delayed transmitted samples. A detection unit detects the burst by confirming whether peaks corresponding to the number of the samples transmitted before the sample of the burst detection are detected by a signal of an value input from the operation unit. Therefore, the present invention can reduce a probability of a false alarm caused by an impulse error and burst errors and thus perform stable burst detection.

20 Claims, 14 Drawing Sheets

US 7,136,434 B2

APPARATUS AND METHOD FOR DETECTING ENERGY OF TONE SIGNAL

BACKGROUND OF THE INVENTION

1. Field of the Invention

The present invention relates to an apparatus and a method for detecting energy of a tone signal, and more particularly, to an apparatus and a method for detecting energy of a tone signal by using a nonlinear tracer. The present application is based on Korean Patent Application No. 2001-69657, filed Nov. 9, 2001, which is incorporated herein by reference.

2. Description of the Related Art

A burst detector has a very important role in a frame transmission system using a preamble. Basically, the burst detector performs a function of detecting the exact time that a frame transmitted to a receiver is received. A detection result of the burst detector generally can be used for two aspects in the receiver.

First of all, unnecessary signal processing and power consumption can be reduced by deciding an appropriate time for the operation of a synchronizer of the receiver. Most receivers define an operation mode and a stand-by mode to prevent power consumption due to unnecessary operation of the receiver when there are no incoming frames. The result of the burst detection is used to decide the mode of operation of the receiver.

Second, the synchronizer of the receiver of the system using a preamble can be operated by a data-aided (DA) method. The method uses a certain preamble pattern decided by the transmitter and receiver, and thus the exact receiving time of the frame is detected and a correlation between a received signal and the preamble is used for a synchronous algorithm.

Generally, burst detection is the same as a process of detecting energy of a signal. As a generally used energy detection algorithm, there are several methods using an absolute value detector (AVD), a root mean square detector (RMSD), and a square law detector (SLD). Energy detection is realized as an absolute value, a square root, and a square being accumulated for a predetermined interval.

While these methods can be used for adjusting the operation mode of the synchronizer, they are not suitable for use with a synchronizer operating according to the DA method since the probability of exactly detecting the burst start symbol detection is low. In other words, when there are many samples, it is hard to detect the exact position (tone element) of the first symbol of the burst. On the contrary, when there are few samples, the number of samples which can be used for observation is also scanty. Thus detection of the energy is unstable and the probability of burst detection success is lower as well. Accordingly, a tone energy detector is appropriate as a burst detector used for adjusting the operation mode of the synchronizer of the receiver and demodulating of the DA method.

Therefore, conventionally, a method using a teager energy operator (TEO) is usually used to detect the symbol of the exact receiving time of the burst. The TEO algorithm is used for detecting a tone signal element of a communication system or a system relating to electroencephalograms used in the medical field. The result of the burst detection by the TEO algorithm is input into the synchronizer of the receiver to decide the operation time and provides a synchronous environment in a receiver using the DA method.

FIG. 1 is a block diagram showing a structure of the apparatus for detecting the energy of the tone signal using a conventional TEO method. FIG. 2 is a view showing the principle of operation of the conventional TEO method.

Referring to FIGS. 1 and 2, the apparatus for detecting the energy of the tone signal using the conventional TEO method has a delay unit 100, a square multiplier 110, a multiplier 120, and a subtractor 130.

Delay unit 100 outputs a sample stream after delaying a transmitted sample stream by a unit of one sample. The square multiplier 110 squares a center sample, where the time the center sample is received is the reference time, for detecting the existence of the tone element, among three samples consecutively transmitted. The multiplier 120 outputs a value after multiplying samples before and after the center sample. The subtractor 130 subtracts a value input by the multiplier 120 from a value input by the square multiplier 110 and outputs the value resulting from the subtraction.

On the other hand, FIG. 2 shows an input and an output of each of the elements shown in FIG. 1. The sample stream input to the delay unit 100 consists of a series of samples obtained by taking one sample per symbol. A signal s(k) input into the square multiplier 110 is a sample transmitted kth, and signals input into the multiplier 120 are samples s(k−1) and s(k+1) that are before and after the signal s(k). Moreover, the output T[s(k)] of the subtractor 130, that is, the final value yielded by the TEO algorithm, is expressed by the following mathematical expression.

$$T_{[s(k)]} = s^2(k) - s(k-1)s(k+1) \quad \text{[Mathematical expression 1]}$$

Here, s(k) is a sample transmitted kth, and $T_{[s(k)]}$ is an output of the TEO algorithm of the kth sample. The TEO algorithm can be performed from the mathematical expression 1 by using the transmitted sample. The total number of samples are three: a center sample of the time for detecting the existence of the tone element, and samples before and after the center sample.

Yet, the TEO algorithm has a high probability of providing a false alarm due to an impulse error and a burst error generated on a channel and has a low probability of success of the burst detection due to a signal attenuation generated at the kth sample for detecting the existence of the burst. Therefore, the TEO algorithm has a high probability of a frame error.

SUMMARY OF THE INVENTION

The present invention has been made to overcome the above-mentioned problems. Thus, the object of the present invention is to provide an apparatus and a method for detecting the energy of tone signals having a low probability of a false alarm caused by an impulse error and a burst error generated on channels and capable of detecting a burst even when there is a signal attenuation at a sample for detecting the burst.

Another object of the present invention is to provide an apparatus and a method for detecting the energy of the tone signals having a low probability of a false alarm caused by some numbers of burst error and a low probability of a detection failure caused by a large noise affecting a sample having a burst.

The above object is accomplished by providing an apparatus for detecting an energy of tone signals comprising: a delay unit for outputting absolute values of transmitted samples after delaying the absolute values according to a predetermined delay interval; a first operation unit for calculating a first operation value by squaring an absolute value of a sample of a reference position input from the delay unit;

a second operation unit for calculating a second operation value by multiplying each absolute value of a plurality of samples, transmitted before the sample of the reference position, input from the delay unit; a third operation unit for calculating a third operation value by multiplying each absolute value of a plurality of samples, transmitted after the sample of the reference position, input from the delay unit; a fourth operation unit for calculating a fourth operation value by multiplying the second operation value and the third operation value; a fifth operation unit for calculating a fifth operation value by subtracting the fourth operation value from the first operation value; and a detection unit for performing a burst detection according to a detection of peak outputs corresponding to the number of the samples transmitted before the sample of the reference position, based on the fifth operation value.

The number of the transmitted samples is an odd number more than five. In addition, it is preferable that the delay interval is a unit of one sample or a unit of two samples.

On the other hand, a method for detecting an energy of tone signals to accomplish the above object comprises the steps of: outputting absolute values of transmitted samples after delaying the absolute values according to a predetermined delay interval; calculating a first operation value by squaring an absolute value of a sample of a reference position among the transmitted samples; calculating a second operation value by multiplying the absolute values of the plurality of samples transmitted before and after the sample of the reference position; calculating a third operation value by subtracting the second operation value from the first operation value; and performing a burst detection according to detection of peak outputs corresponding to the number of the samples transmitted before the sample of the reference position after being input the third operation value.

The number of the transmitted samples is an odd number more than five. It is preferable that the sample of the reference position is a sample placed in a center among the transmitted samples. Moreover, it is advisable that the delay interval is the unit of one sample or the unit of two samples.

An apparatus for detecting an energy of tone signals according to another preferred embodiment of the present invention to accomplish the above object comprises: a delay unit for outputting absolute values of transmitted samples after delaying the absolute values according to a predetermined delay interval; a first operation unit for calculating a first operation value by squaring an absolute value of a sample of a reference position input from the delay unit; a second operation unit for calculating a second operation value by multiplying each absolute value of samples, transmitted before the sample of the reference position, input from the delay unit; a third operation unit for calculating a third operation value by multiplying each absolute value of samples, transmitted after the sample of the reference position, input from the delay unit; a fourth operation unit for calculating a fourth operation value by multiplying the second operation value and the third operation value; a fifth operation unit for calculating a fifth operation value by multiplying the first operation value and the third operation value; a sixth operation unit for outputting a sixth operation value by subtracting the fourth operation value from the fifth operation value; and a detection unit for performing a burst detection according to a detection peak outputs corresponding to a number of the samples transmitted before the sample of the reference position, based on the sixth operation value.

The number of the transmitted samples is an odd number more than five. In addition, it is preferable that the delay interval is the unit of one sample or the unit of two samples.

In the meantime, a method for detecting an energy of tone signals according to the present invention to accomplish another object comprises the steps of: outputting absolute values of transmitted samples after delaying the absolute values according to a predetermined delay interval; calculating a first operation value by squaring an absolute value of a sample of a reference position among the transmitted samples; calculating a second operation value by multiplying the absolute values of the plurality of samples transmitted before and after the sample of the reference position; calculating a third operation value by multiplying magnitudes of the plurality of samples transmitted after the sample of the reference position; calculating a fourth operation value by multiplying the first operation value and the third operation value; calculating a fifth operation value by multiplying the second operation value and the third operation value; calculating a sixth operation value by subtracting the fifth operation value from the fourth operation value; and performing a burst detection according to a detection result of a peak output corresponding to a number of the samples transmitted before the sample of the reference position after being input the sixth operation value.

The number of the transmitted samples is an odd number more than five. In addition, it is preferable that the delay interval is a unit of one sample or a unit of two samples.

Accordingly, the apparatus and the method for detecting the energy of the tone signal can reduce the probability of a false alarm even though there is an impulse error or a predetermined number of burst errors by using an odd number (2M+1) of samples more than five. Moreover, as the number of the samples being used is increased, all of the impulse error and the burst error up to the number of M−1 can be overcome. Therefore, the probability of a false alarm can be decreased.

BRIEF DESCRIPTION OF THE DRAWINGS

The above-mentioned objects and the features of the present invention will be more apparent by describing the preferred embodiments of the present invention by referring to the appended drawings, in which.

DETAILED DESCRIPTION OF THE PREFERRED EMBODIMENTS

Hereinbelow, an apparatus and a method for detecting energy of a tone signal according to the present invention will be described in great detail by referring to the appended drawings.

Figure 1:
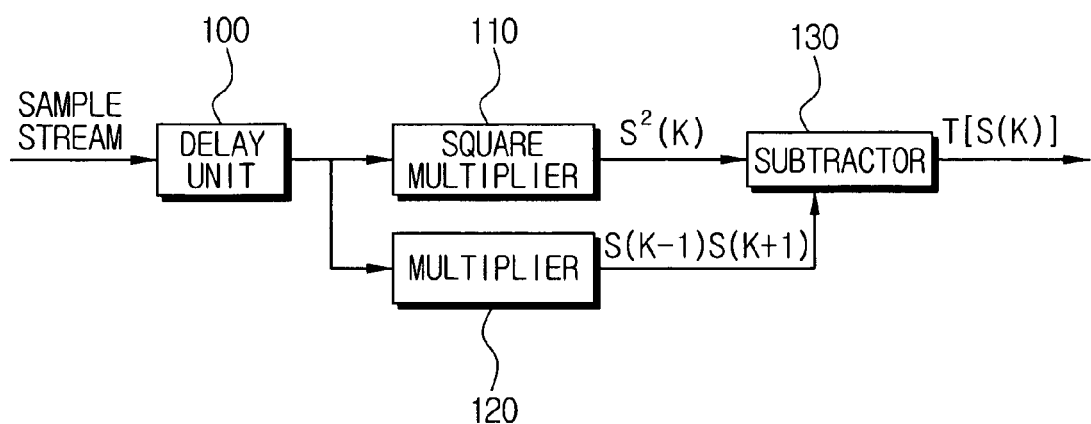
FIG. 1 is a block diagram showing the structure of an apparatus for detecting the energy of a tone signal using a conventional TEO method.
Figure 2:
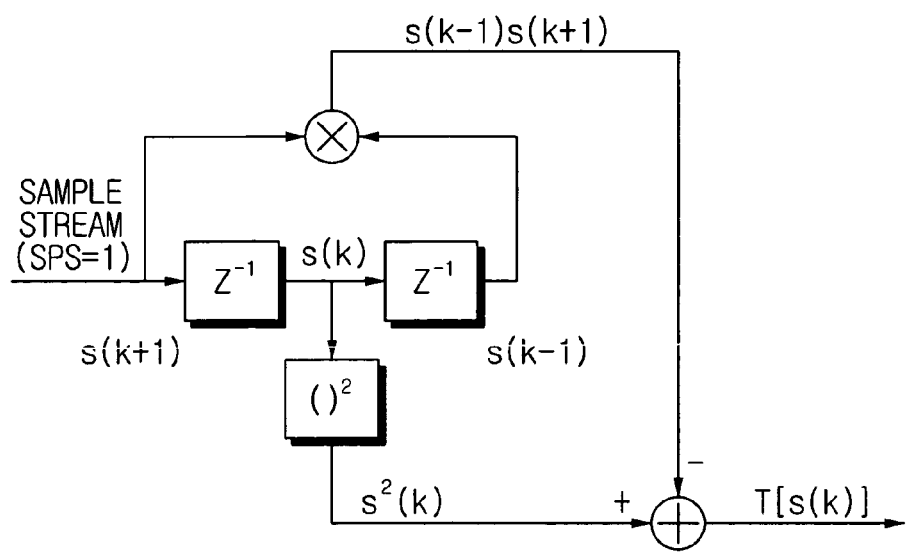
FIG. 2 is a view showing the operation principle of the conventional TEO method.
Figure 3:
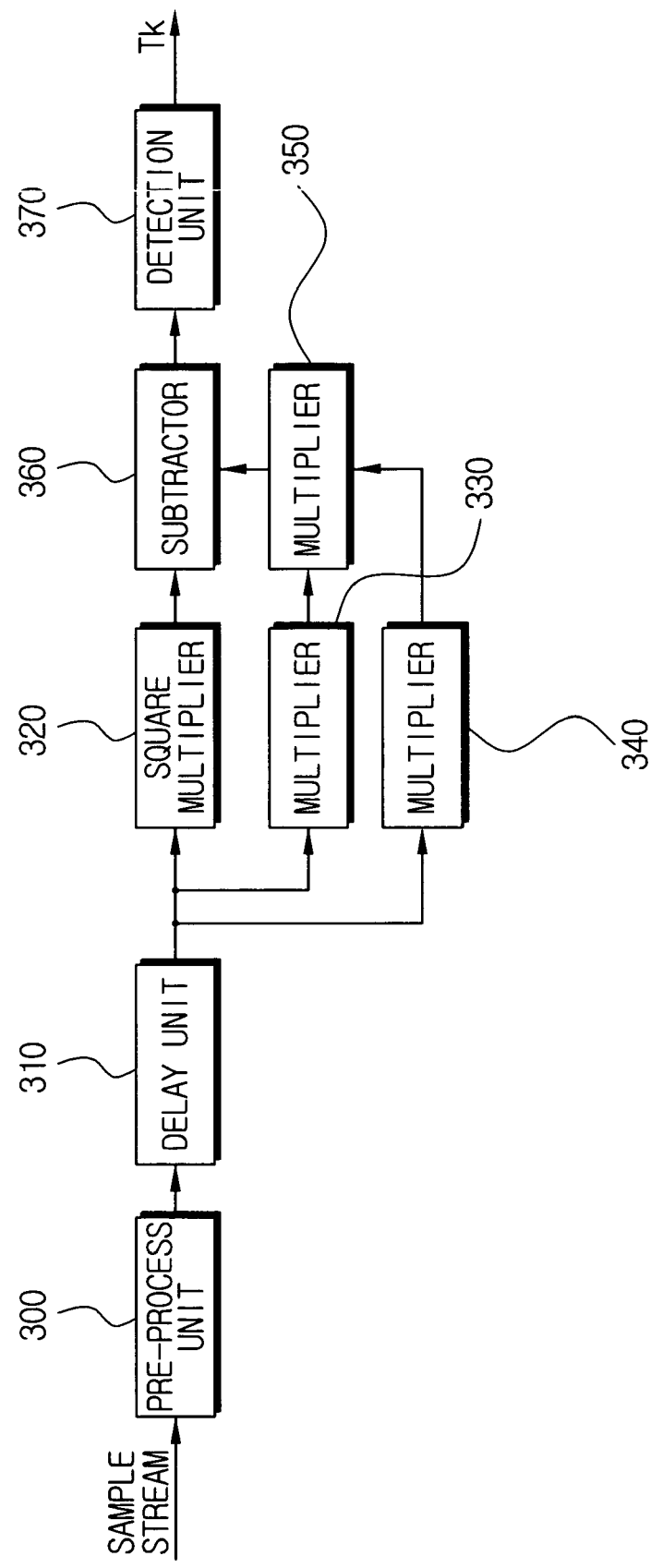
FIG. 3 is a block diagram showing the first preferred embodiment of an apparatus for detecting the energy of a tone signal according to the present invention.
Figure 4:
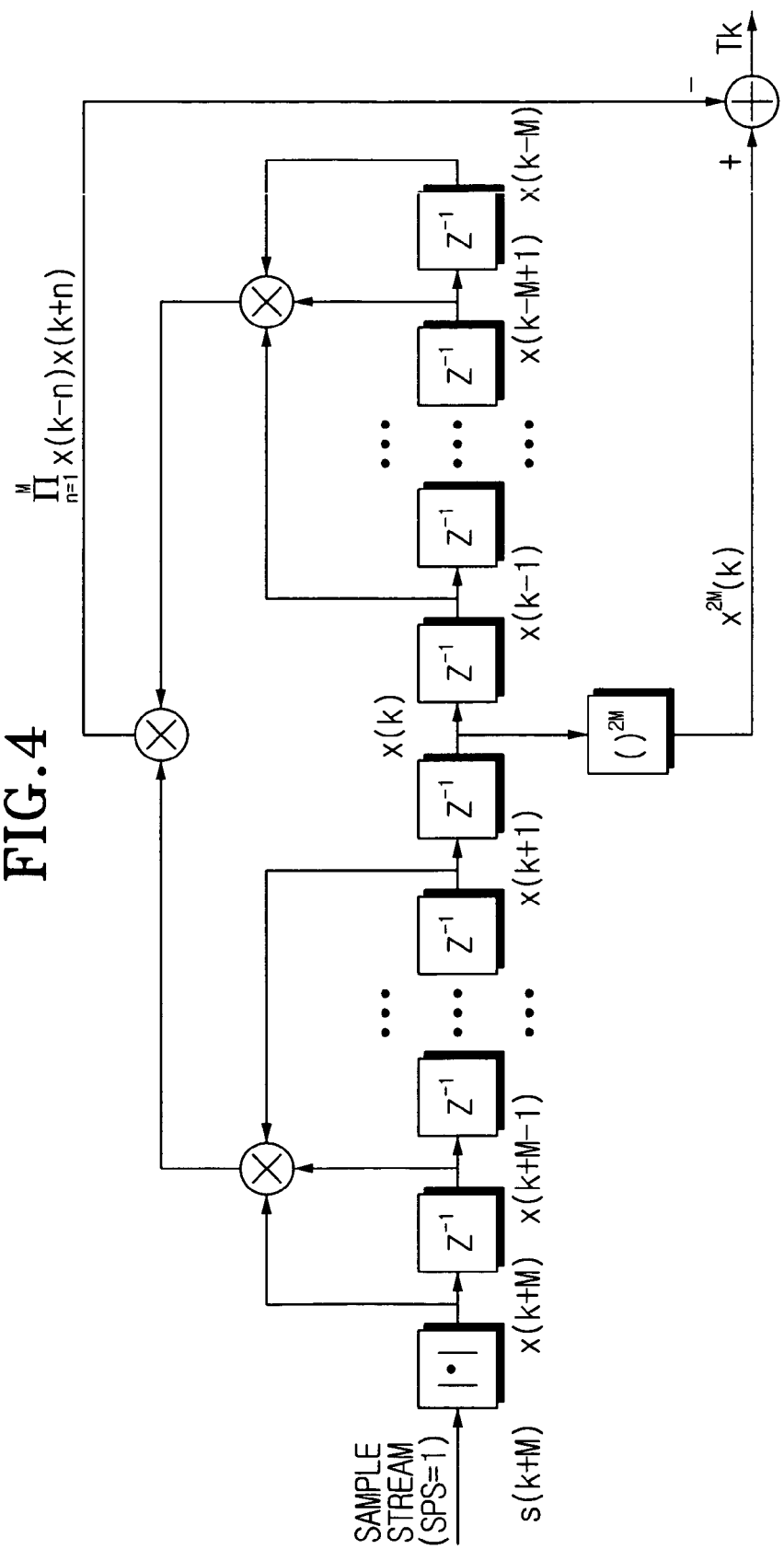
FIG. 4 is a view showing an extended teager energy operator (ETEO) used by the apparatus for detecting the energy of the tone signal according to the present invention.
Figure 5:
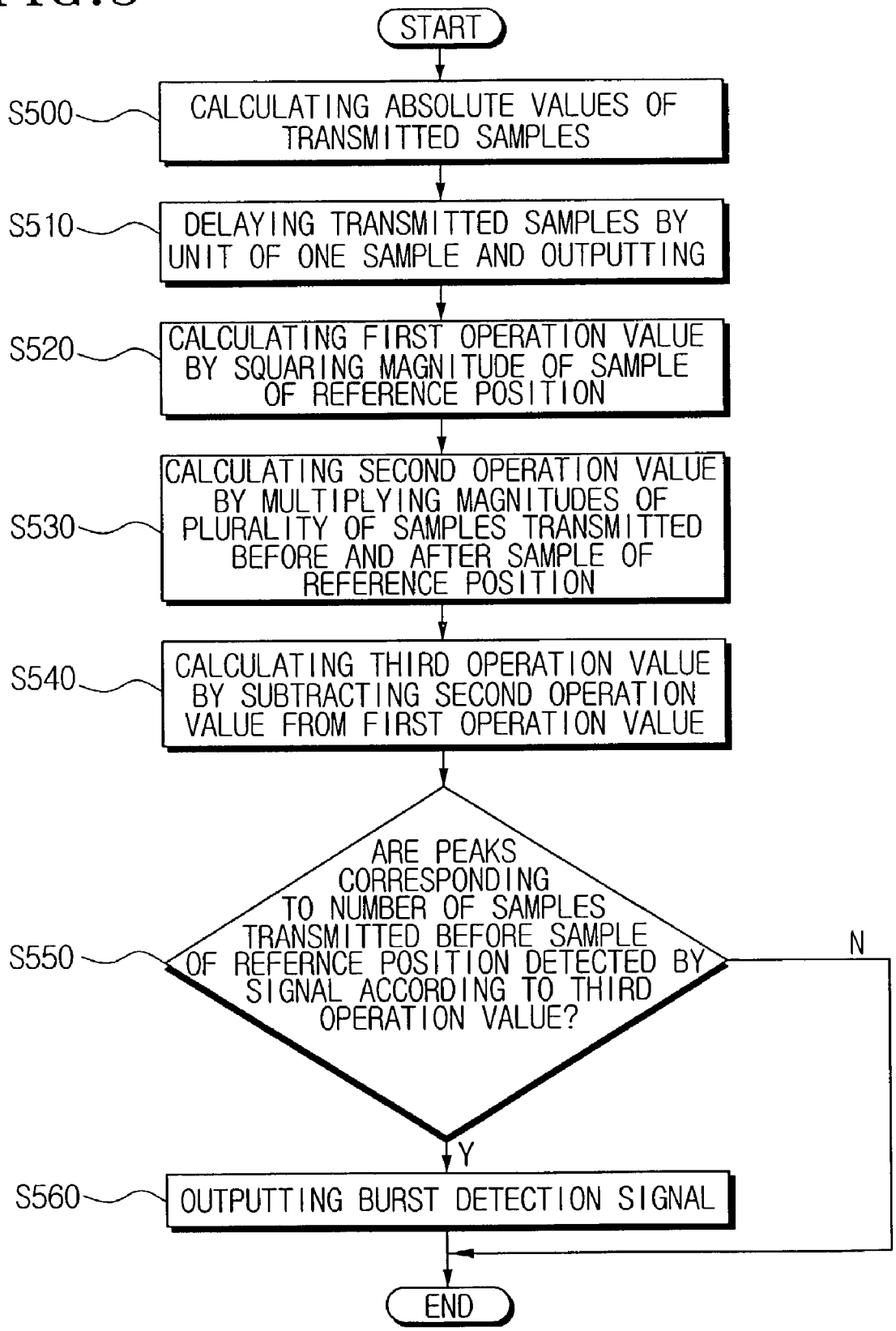
FIG. 5 is a flow chart showing the first preferred embodiment of a method for detecting the energy of the tone signal according to the present invention.

FIG. 3 is a block diagram showing the first preferred embodiment of the apparatus for detecting the energy of the tone signal according to the present invention. FIG. 4 is a view showing an extended teager energy operator (ETEO) used in the apparatus for detecting the energy of the tone signal according to the present invention. FIG. 5 is a flow chart showing the first preferred embodiment of the method for detecting the energy of the tone signal according to the present invention.

Referring to FIGS. 3 to 5, the apparatus for detecting the energy of the tone signal comprises a pre-process unit 300, a delay unit 310, a square multiplier 320, multipliers 330, 340, 350, a subtractor 360, and a detection unit 370.

The pre-process unit 300 calculates absolute values of the transmitted samples and outputs the values to the delay unit 310 (S 500). The delay unit 310 delays the transmitted samples by a unit of one sample, and outputs the samples (S 510). The square multiplier 320 outputs a first operation value by squaring the magnitude of a sample, input from the delay unit 310, corresponding to a time of detecting a burst (S 520). The multiplier 330 receives a plurality of samples transmitted before the sample corresponding to the time of detecting the burst, multiplies each of the magnitudes of the received samples and outputs the multiplied value. In addition, the multiplier 340 receives the magnitudes of a plurality of samples transmitted after the sample corresponding to the time of detecting the burst, multiplies each of the magnitudes and outputs the multiplied value. The multiplier 350 outputs a second operation value by multiplying values received from the multipliers 330 and 340 (S 530).

The subtractor 360 outputs a third operation value by subtracting the second operation value input by the multiplier 350 from the first operation value input by the multiplier 320 (S 540). The detection unit 370 detects peaks corresponding to the number of the samples transmitted before and after the sample detecting the burst by the third operation value input by the subtractor 360 (S 550). When the peaks of the corresponding number are detected, a burst detection signal is output (S 560).

In the first preferred embodiment of the present invention, each sample is extracted per symbol and the number of the samples used for detecting the burst is 2M+1. Here, 'M' means the number of samples from the first sample or the last sample to the samples before and after the sample of the time of detecting the burst among the entire used samples. The number of the samples used for detecting the burst is an odd number more than five. Additionally, the sample at the time of detecting the burst is a sample located at the center of all the samples. While the conventional TEO algorithm directly uses the transmitted sample, the extended TEO (ETEO) algorithm according to the present invention uses a magnitude having an absolute value of the transmitted sample. In the meantime, the result value of the ETEO algorithm shown in FIG. 4 is expressed as the mathematical expression below.

$$T_k = x^{2M}(k) - \Pi_{n=1}^{M} x(k-n)x(k+n) \quad \text{[Mathematical expression 2]}$$

The ETEO algorithm defined by the above mathematical expression 2 has a special feature of always consecutively outputting a number M of peaks from the time the burst is detected. By this feature of the present invention, the probability of the ETEO algorithm producing an error is lower than that of the TEO algorithm.

Figure 6:
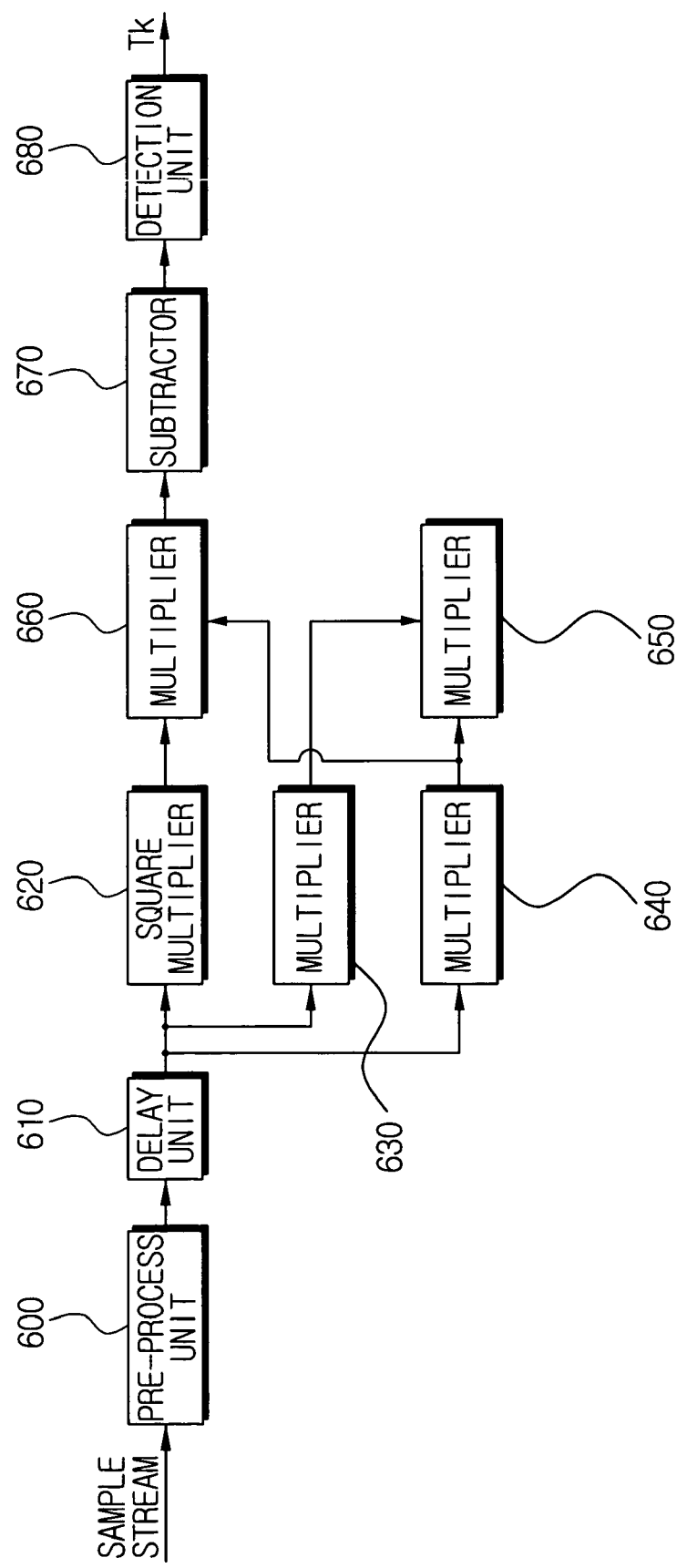
FIG. 6 is a block diagram showing the structure of the second preferred embodiment of an apparatus for detecting the energy of the tone signal according to the present invention.
Figure 7:
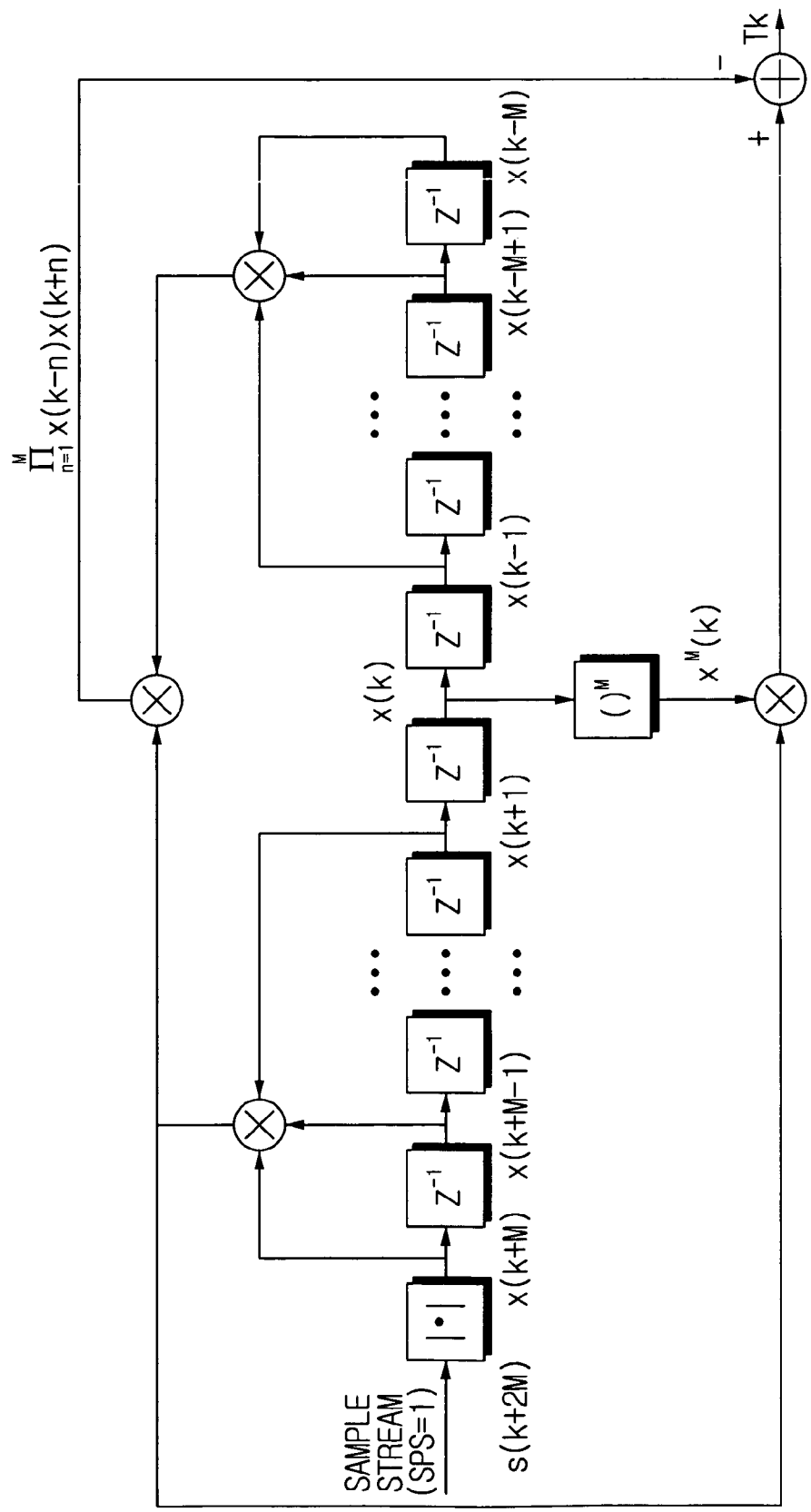
FIG. 7 is a view showing a modified teager energy operator (MTEO) used for the second preferred embodiment of the apparatus for detecting the energy of the tone signal according to the present invention.
Figure 8:
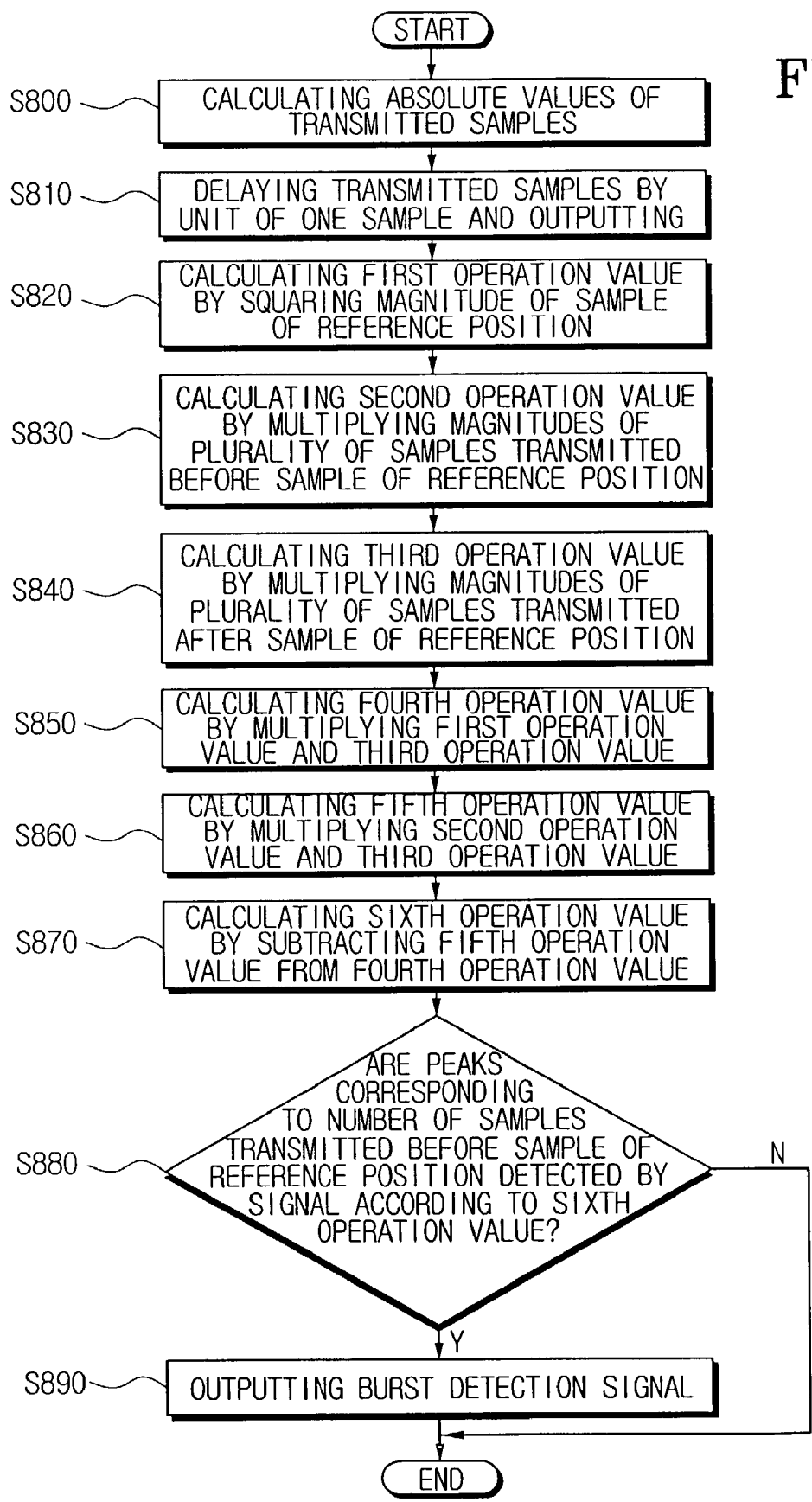
FIG. 8 is a flow chart showing the second preferred embodiment of a method for detecting the energy of the tone signal according to the present invention.

FIG. 6 is a block diagram showing a structure of the second preferred embodiment of the apparatus for detecting the energy of the tone signal according to the present invention. FIG. 7 is a view showing a modified teager energy operator used in the second preferred embodiment of the apparatus for detecting the energy of the tone signal according to the present invention. FIG. 8 is a flow chart showing the second preferred embodiment of the method for detecting the energy of the tone signal according to the present invention.

Referring to FIGS. 6 to 8, the second preferred embodiment of the apparatus for detecting the energy of the tone signal according to the present invention comprises a pre-process unit 600, a delay unit 610, a square multiplier 620, multipliers 630, 640, 650, 660, a subtractor 670, and a detection unit 680.

The pre-process unit 600 calculates the absolute values of the transmitted samples and outputs the values to the delay unit 610 (S 800). The delay unit 610 delays the transmitted samples by a unit of one sample and outputs the samples (S 810). The square multiplier 620 outputs the first operation value by squaring a magnitude of a sample, input from the delay unit 610, corresponding to the time of detecting the burst from the delay unit 610 (S 820). The multiplier 630 outputs the second operation value by multiplying the magnitudes of samples, received from the delay unit 610, transmitted before the sample of the time of detecting the burst (S 830). The multiplier 640 outputs the third operation value by multiplying the magnitudes of samples, received from the delay unit 610, transmitted after the sample of the time of detecting the burst (S 840).

The multiplier 660 outputs a fourth operation value by multiplying the first operation value and the third operation value (S 850). The multiplier 650 outputs a fifth operation value by multiplying the second operation value and the third operation value (S 860). The subtractor 670 outputs a sixth operation value by subtracting the fifth operation value input by the multiplier 650 from the fourth operation value input by the multiplier 660 (S 870). The detection unit 680 detects whether peaks corresponding to the number of the samples transmitted before and after the sample corresponding to the time of detecting the burst by the sixth operation value input by the subtractor 670 (S 880). When the peaks of the corresponding number are detected, the burst detection signal is output (S 890).

In the second preferred embodiment of the present invention, each sample is extracted per symbol and the number of the samples used for detecting the burst is 2M+1. Here, 'M' refers to the number of samples from the first sample or the last sample to the sample just before or after the sample of the time of detecting the burst among all the used samples. The number of samples used for detecting the burst is an odd number more than five. Additionally, the sample of the time of detecting the burst is a sample placed at the center of all the used samples. The MTEO algorithm uses a magnitude having an absolute value of the transmitted sample. In the meantime, the result value of the MTEO algorithm shown in FIG. 7 is expressed as the mathematical expression below.

$$T_k = x^M(k) \Pi_{n=1}^M x(k+n) - \Pi_{n=1}^M x(k-n) x(k+n) \quad \text{[Mathematical expression]}$$

On the other hand, the ETEO algorithm has a probability of an error in indicating the burst error more than M due to the 2M square term corresponding to the magnitude of the sample at the point where the burst exists, and the probability of detection failure caused by a noise affecting to the sample at the point where the burst exists. The MTEO algorithm defined as the above mathematical expression 3 substitutes a term (the first term of the mathematical expression 3) calculated by multiplying the M square value of the magnitude of the kth sample with the magnitude of the M sample after the kth sample for the 2M square term (the first term of the mathematical expression 2) of the magnitude of the Kth sample of the ETEO algorithm.

The MTEO algorithm modified as above can remarkably reduce the probability of the detection failure caused by large interferences generated at the time when the burst exists. That is because the MTEO burst detection algorithm does not largely depend on the 2M square term of the magnitude of the kth sample, but the MTEO burst detection algorithm depends on the M square value of the magnitude of the kth sample and also on the magnitude of M samples after the kth sample. The MTEO algorithm has a characteristic of generation of the consecutive M peaks output from the start of the burst detection as the ETEO algorithm.

Figure 9:
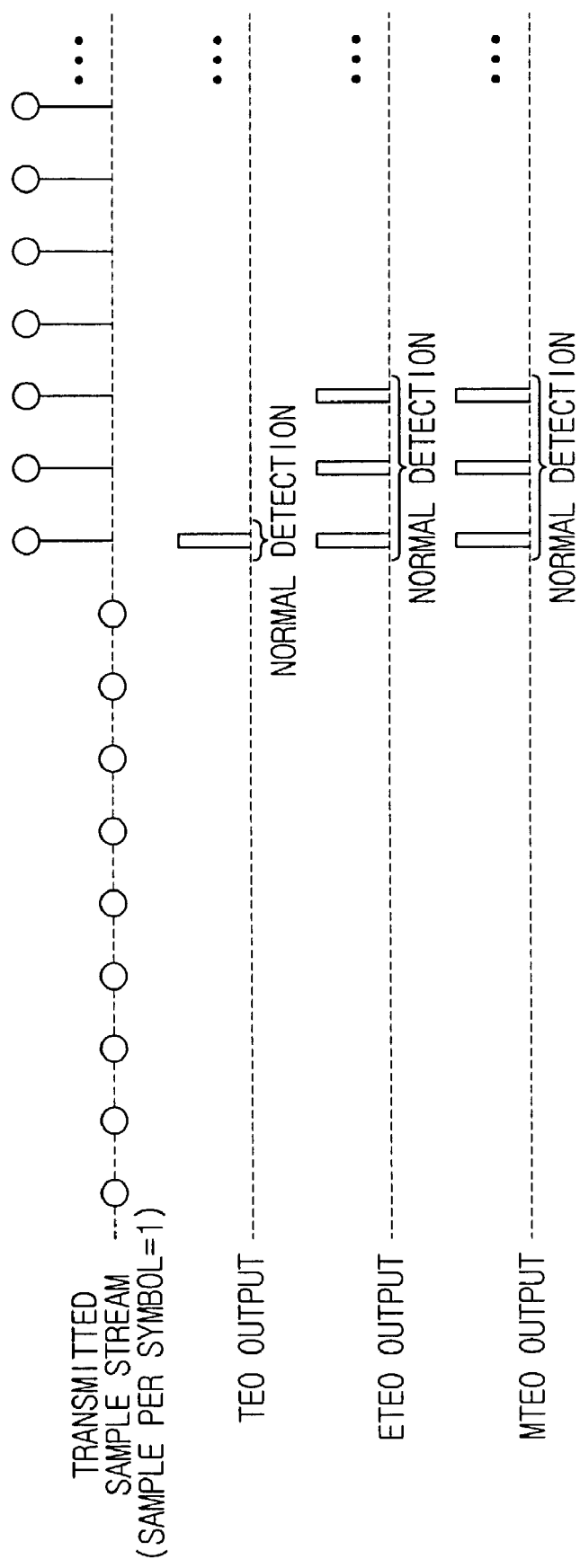
FIG. 9 is a view showing the output of the TEO, ETEO, and MTEO algorithm when there is no error.

FIG. 9 is a view showing the output of the TEO, ETEO, and MTEO algorithm when there is no error. Referring to FIG. 9, when there is no error generated at the time of receiving, the TEO, ETEO, and MTEO algorithm can all normally detect the burst.

Figure 10:
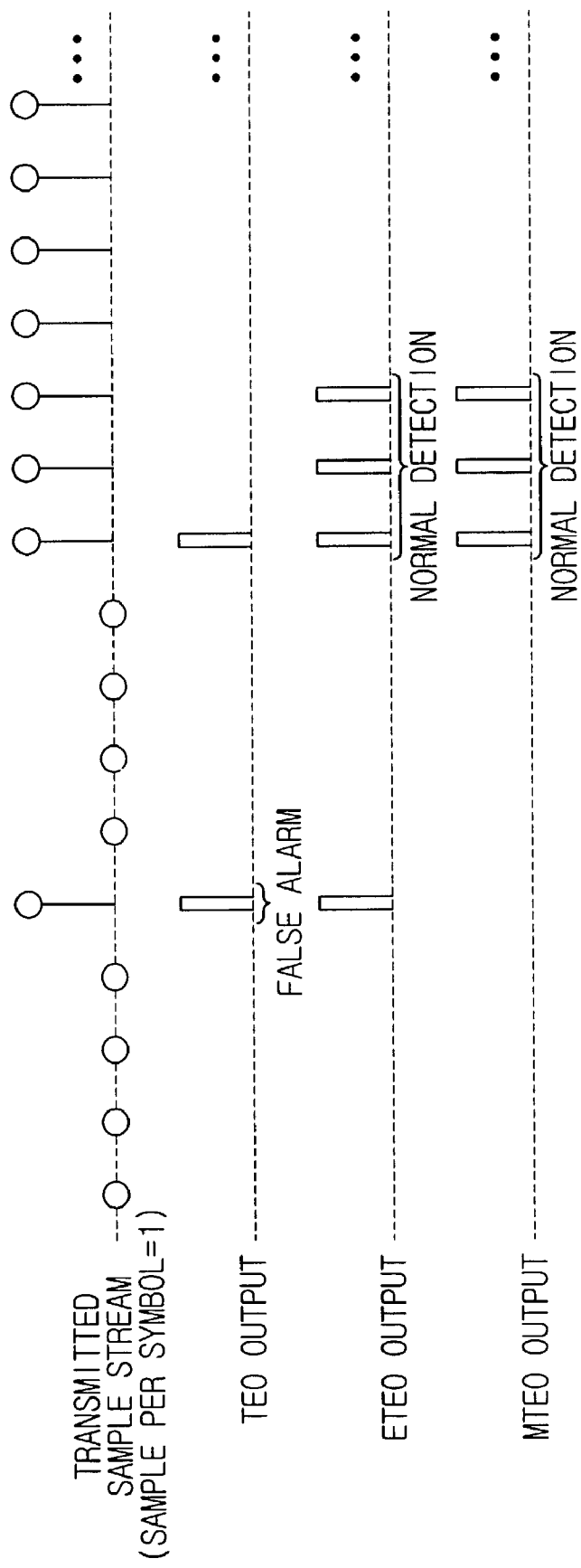
FIG. 10 is a view showing the output of the TEO, ETEO, and MTEO algorithm when there is an impulse error.

FIG. 10 is a view showing the output of the TEO, ETEO, and MTEO algorithm when there is an impulse error. Referring to FIG. 10, it can be seen that while the TEO algorithm has a false alarm, the ETEO algorithm can successfully detect the burst by using the characteristic of the consecutive output of the peaks. In the meantime, the MTEO algorithm can overcome the impulse error without using the characteristic of the consecutive output of the M peaks unlike the ETEO algorithm.

Figure 11:
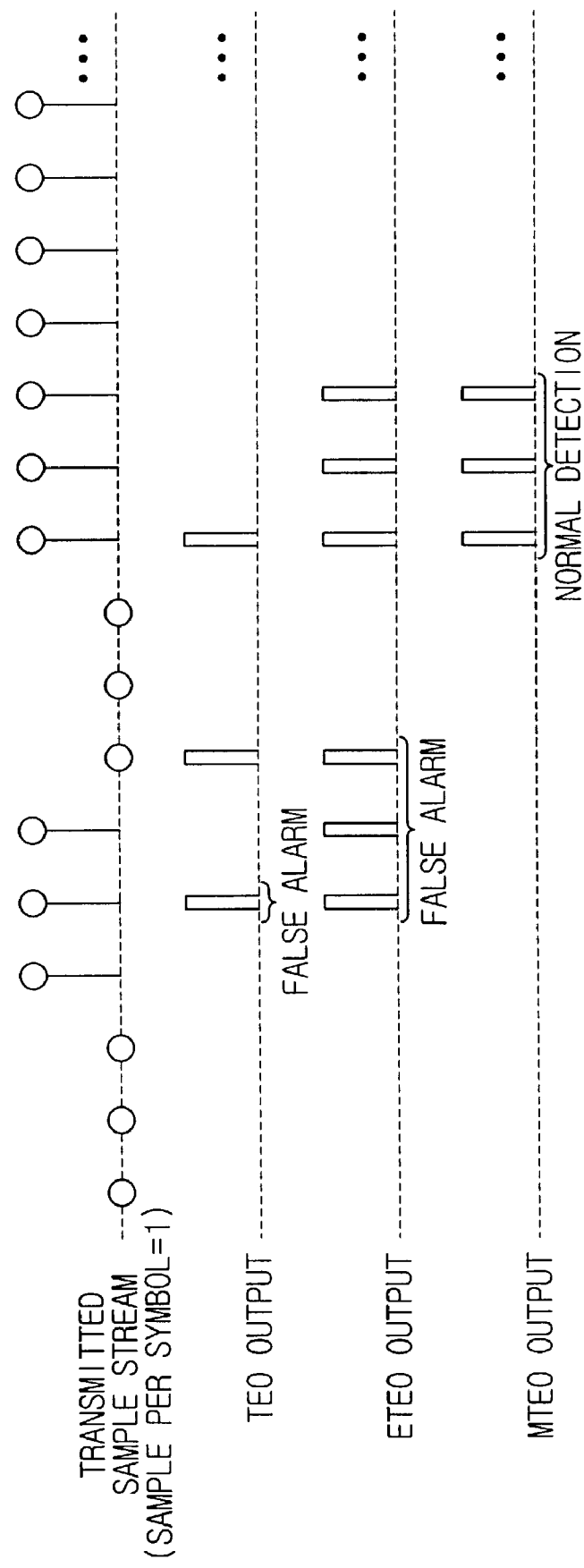
FIG. 11 is a view showing the output of the TEO, ETEO, and MTEO algorithm when there is a burst error.

FIG. 11 is a view showing the output of the TEO, ETEO, and MTEO algorithm when there is a burst error. Referring to FIG. 11, it can be seen that while the TEO algorithm has the false error in regard to the burst error, the ETEO algorithm can overcome the burst error up to the number of M−1. On the other hand, the MTEO algorithm can successfully detect the burst by using the characteristic of the consecutive output of the peaks. The MTEO algorithm can overcome the burst error up to the number of 2M−1, which is larger than that of the ETEO algorithm by M.

Figure 12:
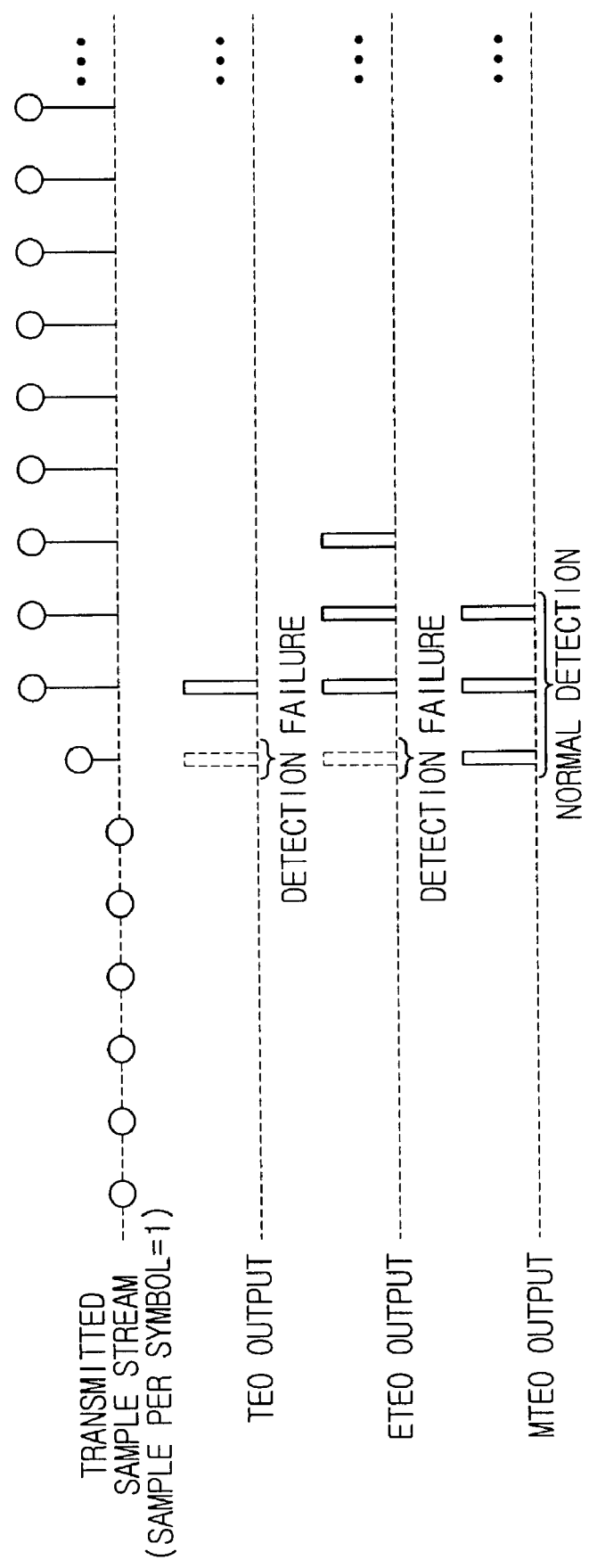
FIG. 12 is a view showing the output of the TEO, ETEO, and MTEO algorithm when there is an error due to signal attenuation at the sample having the burst.

FIG. 12 is a view showing the output of the TEO, ETEO, and MTEO algorithm when there is an error due to signal attenuation of the sample starting the burst. Referring to FIG. 12, it can be seen that while the TEO and the ETEO algorithm fail to detect the burst, the MTEO algorithm detects the burst.

Figure 13:
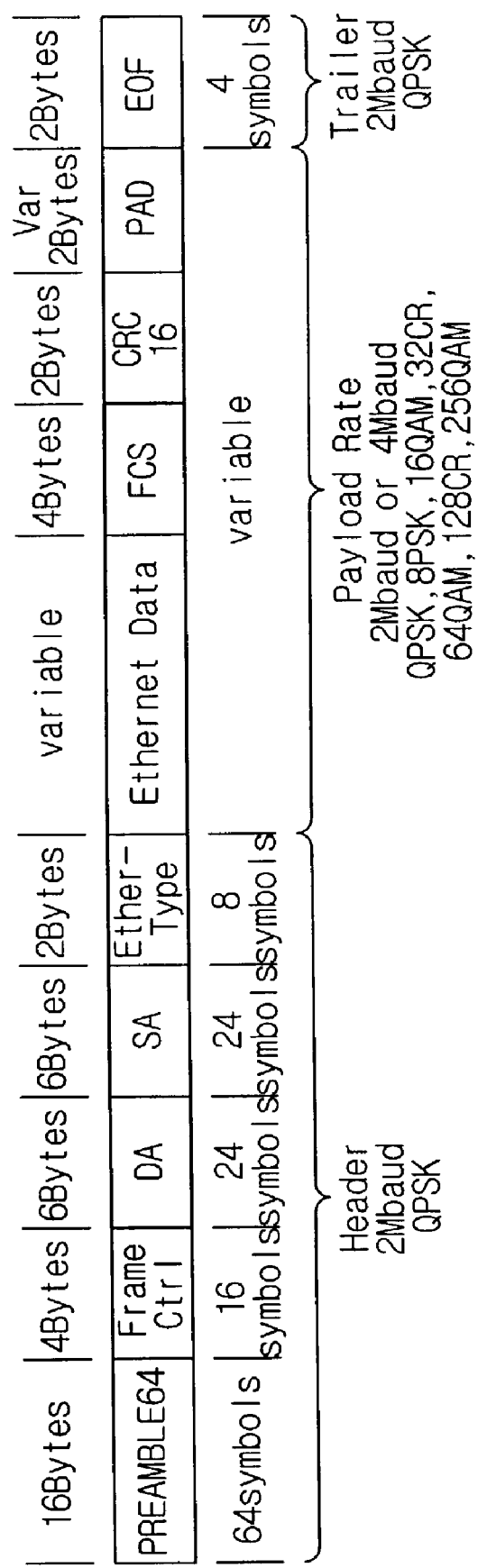
FIG. 13 is a view showing a frame standard of 10M8 HomePNA (Home Phone-line Networking Alliance) system.

FIG. 13 is a view showing a frame standard of a 10M8 HomePNA (Home Phone-line Networking Alliance) system. An Ethernet packet shown in FIG. 13 has 64 preamble symbols for synchronizing. The 10M8 HomePNA system is a representative TDMA (Time Division Multiple Access) system using the frame standard shown in FIG. 13. Accordingly, for the 10M8 HomePNA transmitter, a position of the detector capable of effectively detecting the burst started with the preamble, and a method for utilizing the algorithm and a detection result in a synchronizing portion is important. Generally, the detection result of the detector is used for deciding the time of operation of the transmitter and a data-aided synchronization.

In the meantime, the preamble composing a first part of the burst in the 10M8 HomePNA has a structure in which zero is inserted between the symbols since the preamble is always modulated as FDQAM (Frequency Diverse Quadrature Amplitude Modulation). Therefore, when the apparatus for detecting the energy of the tone signal using the ETEO or the MTEO algorithm described referring to FIGS. 3 to 8 is employed, there may be a deterioration in result. This deterioration in result is because zero is used for detecting the burst, thus interference occurring at the position of zero causes the output of the detecting apparatus to be unstable. Thus, to apply the apparatus and the method for detecting the energy of the tone signal according to the present invention to the 10M8 HomePNA system, the burst detection algorithm should be modified to be operated with respect to a valid symbol of a region of the preamble.

Figure 14:
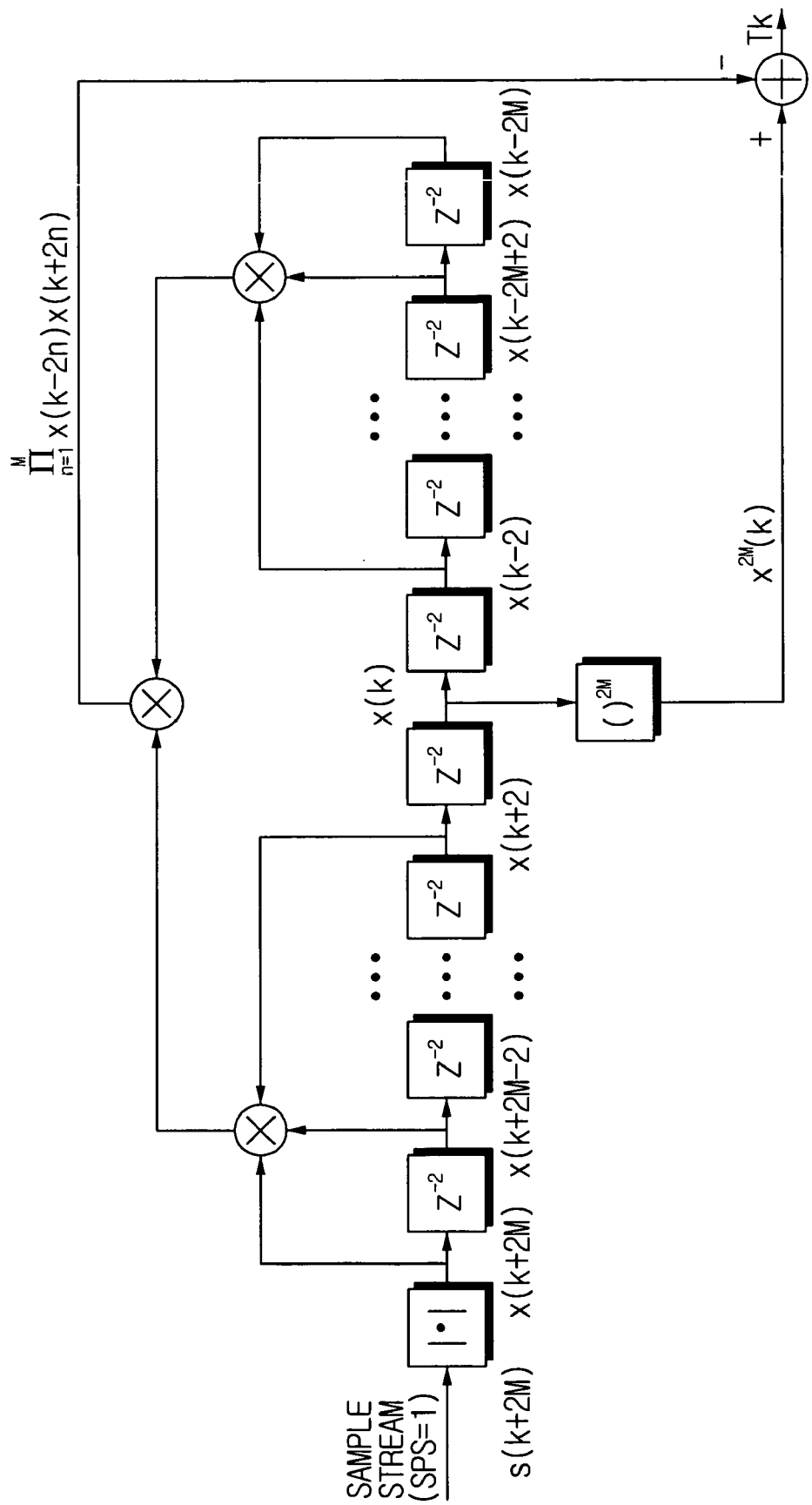
FIGS. 14 and 15 are views respectively showing modified examples of the ETEO algorithm shown in FIG. 4 and the MTEO algorithm shown in FIG. 7 for applying to the 10M8 HomePNA system.
Figure 15:
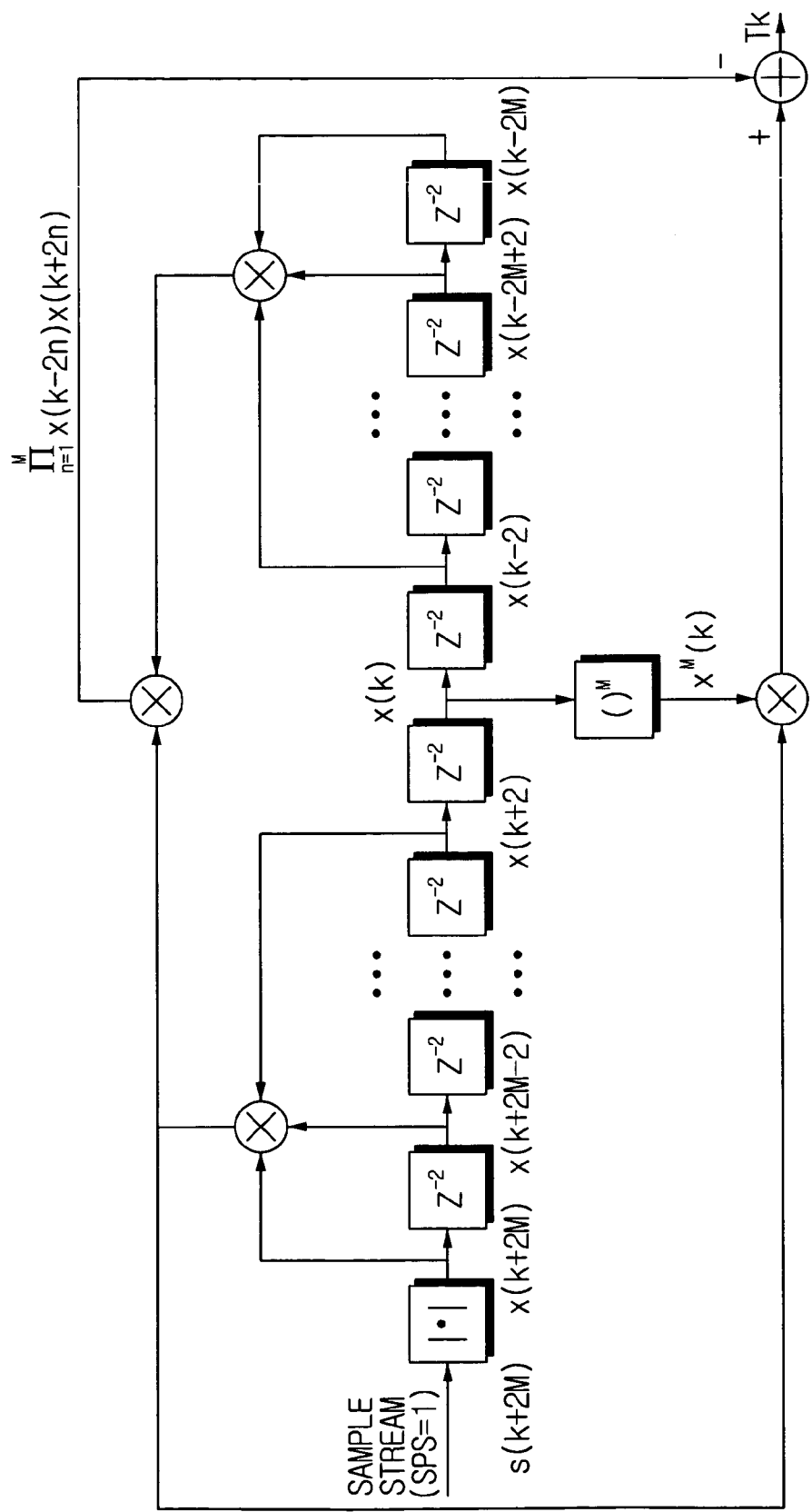

FIGS. 14 and 15 are views respectively showing modified examples of the ETEO algorithm shown in FIG. 4 and the MTEO algorithm shown in FIG. 7 for applying to the 10M8 HomePNA system. Referring to FIGS. 14 and 15, it is known that the energy of the tone signal is detected by delaying the absolute values of the transmitted samples by a unit of two samples.

On the other hand, the apparatus for detecting the energy of the tone signal applied to the 10M8 HomePNA system can replace the delay unit 310, 610 in the apparatus for detecting energy of the tone signal shown respectively in FIGS. 3 and 6 with an element delaying by a unit of two samples. In addition, the method for detecting the energy of the tone signal of the 10M8 HomePNA system can delay the transmitted sample by a unit of two samples instead of the unit of one sample in the method for detecting the energy of the tone signal shown in FIGS. 5 and 8. Therefore, the detailed description of the 10M8 HomePNA will be omitted here.

When the ETEO and the MTEO algorithms are applied to the 10M8 HomePNA system the algorithms are expressed according to the following the mathematical expressions.

$$T_k = x^{2M}(k) - \Pi_{n=1}^M x(k-2n) x(k+2n) \quad \text{[Mathematical expression 4]}$$

$$T_k = x^M(k) \Pi_{n=1}^M x(k+2n) - \Pi_{n=1}^M x(k-2n) \quad \text{[Mathematical expression 5]}$$

Here, in the mathematical expressions 4 and 5, M refers to the number of samples from the first sample or the last sample to the samples before and after the sample of the time of detecting the burst among all the used samples. The number of samples used for detecting M bursts is an odd number more than five. Additionally, the sample of the time of detecting the burst is a sample located at the center of all the used samples. On the other hand, the number of samples used for detecting the burst is 2M+1, and each sample is extracted per symbol.

By using the apparatus and the method for detecting the energy of the tone signal according to the present invention using the ETEO algorithm, the probability of a false alarm can be largely reduced even though there is an impulse error or some number of burst error since an odd number greater than five (2M+1) of samples are used. Furthermore, as the number of samples used is increased, all of the impulse errors and the burst errors up to the number of M−1 can be overcome. Thus, the probability of a false alarm can be greatly decreased. Accordingly, the apparatus and the method for detecting the energy of the tone signal according to the present invention has a lower probability of false alarm and a more effective burst detection at the same level of complexity compared to the conventional apparatus and method for detecting the energy of the tone signal. Furthermore, more stable burst detection can be obtained as the magnitude of the transmitted signal is used for detecting the energy of the tone signal.

In the meantime, the apparatus and the method for detecting the energy of the tone signal according to the present invention using the MTEO algorithm uses an odd number (2M+1) greater than five of samples for detecting the burst and at the same time, judges whether the burst is detected by multiplying the magnitudes of the plurality of samples transmitted after the sample used for detecting the burst and the magnitude of the sample transmitted at the time when the burst is detected. Therefore, the apparatus and the method for detecting the energy of the tone signal according to the present invention using the MTEO algorithm can overcome up to 2M−1 impulse errors and burst errors. Moreover, even when there is an error caused by signal attenuation at the time when the burst is detected, the burst can be detected. Furthermore, the complexity of the apparatus and the method for detecting the energy of the tone signal using the ETEO algorithm is the same as the conventional apparatus and the method for detecting the energy of the tone signal, but the capability is much better than the conventional system.

So far, the preferred embodiments of the present invention have been illustrated and described. However, the present invention is not limited to the preferred embodiments described here, and someone skilled in the art can modify the present invention without departing from the spirit of the present invention claimed in the appended claims.

What is claimed is:

1. An apparatus for detecting an energy of tone signals, comprising:
   a delay unit for outputting absolute values of transmitted samples after delaying the absolute values according to a predetermined delay interval;
   a first operation unit for calculating a first operation value by squaring an absolute value of a sample of a reference position input from the delay unit;
   a second operation unit for calculating a second operation value by multiplying each absolute value of a plurality of samples, transmitted before and after the sample of the reference position, input from the delay unit;
   a third operation unit for calculating a third operation value by subtracting the second operation value from the first operation value; and
   a detection unit for performing a burst detection according to a detection of peak outputs corresponding to the number of the samples transmitted before the sample of the reference position, based on the third operation value,
   wherein the second operation unit comprises a fourth operation unit for calculating a fourth operation value by multiplying each absolute value of the plurality of samples, transmitted before the sample of the reference position, input from the delay unit; a fifth operation unit for calculating a fifth operation value by multiplying each absolute value of the plurality of samples, transmitted after the sample of the reference position, input from the delay unit; and a sixth operation unit for multiplying the fourth operation value by the fifth operation value to produce the second operation value.

2. The apparatus of claim 1, wherein the delay interval is unit of one sample.

3. The apparatus of claim 1, wherein the delay interval is unit of two samples.

4. The apparatus of claim 1, wherein the number of the transmitted samples is an odd number more than five.

5. The apparatus of claim 1, wherein the delay interval is unit of one sample.

6. The apparatus of claim 1, wherein the delay interval is unit of two samples.

7. The apparatus of claim 1, wherein the number of the transmitted samples is an odd number more than five.

8. A method for detecting an energy of tone signals, comprising the steps of:
   outputting absolute values of transmitted samples after delaying the absolute values according to a predetermined delay interval;
   calculating a first operation value by squaring an absolute value of a sample of a reference position among the transmitted samples;
   calculating a second operation value by multiplying the absolute values of the plurality of samples transmitted before and after the sample of the reference position;
   calculating a third operation value by subtracting the second operation value from the first operation value; and
   performing a burst detection according to detection of peak outputs corresponding to the number of the samples transmitted before the sample of the reference position after being input the third operation value;
   wherein calculating a second operation value comprises calculating a fourth operation value by multiplying each absolute value of the plurality of samples, transmitted before the sample of the reference position; and calculating a fifth operation value by multiplying each absolute value of the plurality of samples, transmitted after the sample of the reference position; and calculating a sixth operation value by multiplying the fourth operation value by the fifth operation value to produce the second operation value.

9. The method of claim 8, wherein the delay interval is a unit of one sample.

10. The method of claim 8, wherein the delay interval is a unit of two samples.

11. The method of claim 8, wherein the number of the transmitted samples is an odd number more than five.

12. The method of claim 11, wherein the sample of the reference position is a sample placed in a center among the transmitted samples.

13. An apparatus for detecting an energy of tone signals, comprising:
   a delay unit for outputting absolute values of transmitted samples after delaying the absolute values according to a predetermined delay interval;
   a first operation unit for calculating a first operation value by squaring an absolute value of a sample of a reference position input from the delay unit;

a second operation unit for calculating a second operation value by multiplying each absolute value of samples, transmitted before the sample of the reference position, input from the delay unit;

a third operation unit for calculating a third operation value by multiplying each absolute value of samples, transmitted after the sample of the reference position, input from the delay unit;

a fourth operation unit for calculating a fourth operation value by multiplying the first operation value and the third operation value;

a fifth operation unit for calculating a fifth operation value by multiplying the second operation value and the third operation value;

a sixth operation unit for outputting a sixth operation value by subtracting the fifth operation value from the fourth operation value; and a detection unit for performing a burst detection according to a detection of peak outputs corresponding to a number of the samples transmitted before the sample of the reference position, based on the sixth operation value.

14. The apparatus of claim 13, wherein the delay interval is a unit of one sample.

15. The apparatus of claim 13, wherein the delay interval is a unit of two samples.

16. The apparatus of claim 13, wherein the number of the transmitted samples is an odd number more than five.

17. A method for detecting an energy of a tone signal, comprising the steps of:

outputting absolute values of transmitted samples after delaying the absolute values according to a predetermined delay interval;

calculating a first operation value by squaring an absolute value of a sample of a reference position among the transmitted samples;

calculating a second operation value by multiplying the absolute values of the plurality of samples transmitted before the sample of the reference position;

calculating a third operation value by multiplying magnitudes of the plurality of samples transmitted after the sample of the reference position;

calculating a fourth operation value by multiplying the first operation value and the third operation value;

calculating a fifth operation value by multiplying the second operation value and the third operation value;

calculating a sixth operation value by subtracting the fifth operation value from the forth operation value; and performing a burst detection according to a detection result of a peak output corresponding to a number of the samples transmitted before the sample of the reference position after being input the sixth operation value.

18. The method of claim 17, wherein the delay interval is a unit of one sample.

19. The method of claim 17, wherein the delay interval is a unit of two samples.

20. The method of claim 17, wherein the number of the transmitted samples is an odd number more than five.

* * * * *